United States Patent [19]

Fujiki

[11] Patent Number: 5,497,137
[45] Date of Patent: Mar. 5, 1996

[54] CHIP TYPE TRANSFORMER

[75] Inventor: Yasuhiro Fujiki, Nagaokakyo, Japan

[73] Assignee: Murata Manufacturing Co., Ltd., Japan

[21] Appl. No.: 357,704

[22] Filed: Dec. 16, 1994

[30] Foreign Application Priority Data

Dec. 17, 1993 [JP] Japan ..................................... 5-344361

[51] Int. Cl.⁶ ..................................................... H01F 5/00
[52] U.S. Cl. ............................................. 336/200; 336/232
[58] Field of Search ..................................... 336/200, 232

[56] References Cited

U.S. PATENT DOCUMENTS

| | | | |
|---|---|---|---|
| 3,002,260 | 10/1961 | Shortt et al. | 336/200 |
| 4,369,557 | 1/1983 | Vandebult | 29/25.42 |
| 5,012,571 | 5/1991 | Fujita et al. | 29/598 |
| 5,034,710 | 7/1991 | Kawaguchi | 333/185 |
| 5,039,964 | 8/1991 | Ikeda | 333/181 |
| 5,276,421 | 1/1994 | Boitard | 336/180 |
| 5,381,124 | 1/1995 | Roshen | 336/200 |

*Primary Examiner*—Laura Thomas
*Attorney, Agent, or Firm*—Ostrolenk, Faber, Gerb & Soffen

[57] ABSTRACT

A balun transformer (10) may be constructed as a chip type transformer including a laminate (12) having first through fifth dielectric substrates (14a), (14b), (14c), (14d), and (14e) to be superimposed one on the other. An earth electrode (16) is formed on one main surface of the first dielectric substrate (14a), and an earth electrode (30) is formed on one main surface of the fifth dielectric substrate (14e). A connecting electrode (20) is formed on one main surface of the second dielectric substrate (14b). A first strip line (22) is formed on one main surface of the third dielectric substrate (14c). The first strip line (22) consists of a first spiral portion (24a) and a second spiral portion (24b). A second spiral strip line (26) and a third spiral strip line (28) are formed on one main surface of the fourth dielectric substrate (14d). The second strip line (26) and the third strip line (28) are electromagnetically connected with the first portion (24a) of the first strip line (22) and the second portion (24b) thereof, respectively.

6 Claims, 12 Drawing Sheets

F I G.10
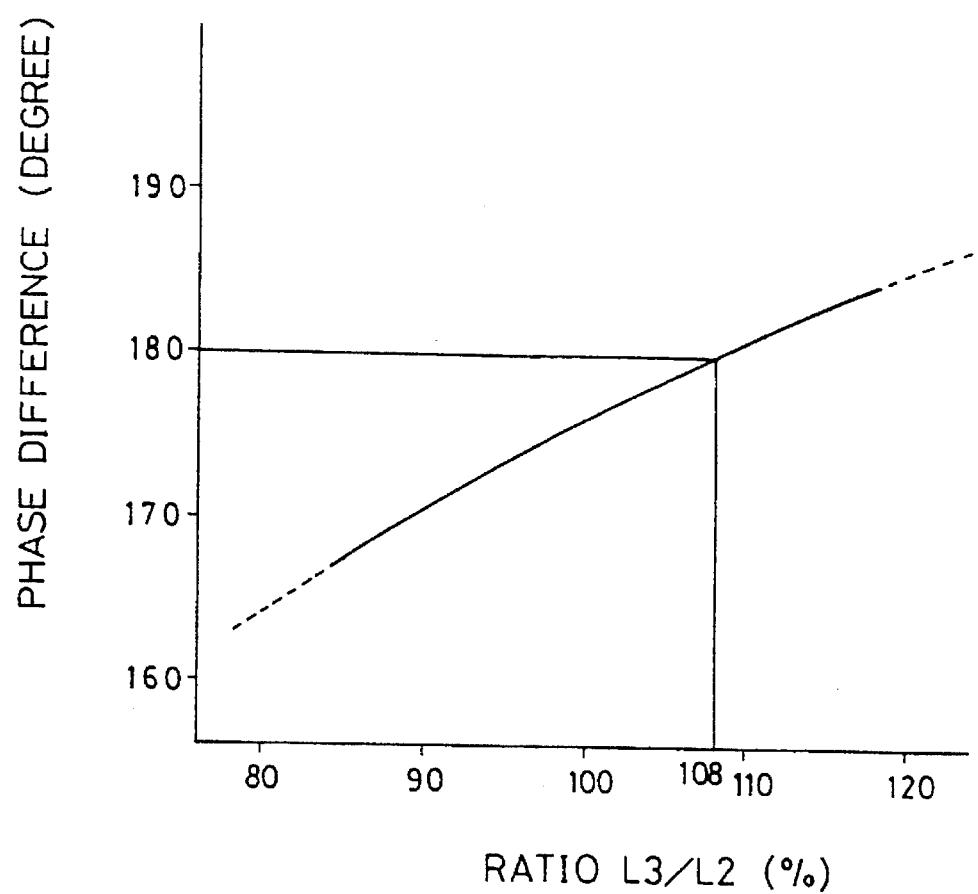

CHIP TYPE TRANSFORMER

BACKGROUND OF THE INVENTION

1. Field of the Invention

The present invention relates to a chip type transformer, and more particularly, to a chip type transformer usable as a balun transformer in an impedance converter for converting the impedance of a transmission line of a high frequency circuit having a frequency higher than that of a UHF band, a signal converter for converting a signal of a balanced transmission line and a signal of an unbalanced transmission line into each other, a phase converter, and the like.

2. Description of the Prior Art

The balun transformer is a device to convert the signal of the balanced transmission line and the signal of the unbalanced transmission line into each other. The word "balun" is an abbreviation of "balanced-unbalanced".

As shown in FIG. 11, the balanced transmission line has two signal lines forming a pair, thus transmitting a signal as the potential difference between the two signal lines. Because external noise affects the two signal lines of the balanced transmission line equally, the external noise is offset, and thus it is hard for the external noise to affect the balanced transmission line. Because the circuit of an analog IC is constituted of a differential amplifier, many input-output terminals of the analog IC are of the balanced type, i.e., the input-output terminals input signals to the circuit and output them therefrom as a voltage difference between the two input-output terminals.

As shown in FIG. 12, the unbalanced transmission line transmits a signal as the potential of one transmission line relative to the ground potential (zero potential). As the unbalanced transmission line, a coaxial line and a signal line (micro strip line) provided on a substrate are known.

FIG. 13 is an illustrative view showing an example of a balun transformer which is in the background of the present invention and to which the present invention is applied. A balun transformer 1 has three input/output terminals 2a, 2b, and 2c. In order to convert the signal of the unbalanced transmission line and that of the balanced transmission line into each other, the unbalanced transmission line is connected with the input/output terminal 2a, while two signal lines of the balanced transmission line are connected with the input/output terminals 2b and 2c, respectively. The balun transformer 1 takes out the signal from the unbalanced transmission line, thus supplying the signal to a portion between the two signal lines of the balanced transmission line, or takes out the signal of the portion between the two signal lines of the balanced transmission line, thus supplying the signal to the unbalanced transmission line.

FIG. 14 is a perspective view showing an example of a conventional balun transformer used a core. A balun transformer 1 shown in FIG. 14 includes an 8-shaped core 3 around which a plurality of coils consisting of three coils 4a, 4b, and 4c is wound. The ends of the coils 4a, 4b, and 4c are connected with the input/output terminals 2a, 2b, and 2c, respectively, while the other end of each of the coils 4a, 4b, and 4c is grounded. Thus, the balun transformer 1 shown in FIG. 14 has an equivalent circuit shown in FIG. 15.

However, the balun transformer 1 shown in FIG. 14 has great losses when converting signals in a high frequency band having a higher frequency than that of a UHF band, as shown by the frequency characteristic thereof in FIG. 16. In addition, the balun transformer 1 cannot be miniaturized beyond a certain size.

For these reasons, a balun transformer having a coaxial construction is used in bands having frequencies higher than that of the UHF band.

FIG. 17 is an illustrative view showing an example of a conventional balun transformer having the coaxial construction. A balun transformer 1 shown in FIG. 17 has a center electrode 5. One input-output terminal 2a is connected with one end of the center electrode 5. The other end of the center electrode 5 is opened. Two inner electrodes 6a and 6b are provided around the periphery of the center electrode 5 so as to connect with the center electrode 5 magnetically. The inner end of the inner electrode 6a is connected with the input-output terminal 2b via a drawing line 7a, whereas the inner end of the inner electrode 6b is connected with the input-output terminal 2c via a drawing line 7b. An earth electrode 8 is provided around the periphery of the inner electrodes 6a and 6b so as to sandwich a dielectric material between the earth electrode 8 and the inner electrodes 6a and 6b. One end of the earth electrode 8 is connected with the outer end of the inner electrode 6a, while the other end thereof is connected with the outer end of the inner electrode 6b. Thus, the balun transformer 1 shown in FIG. 17 has an equivalent circuit shown in FIG. 18.

The size accuracy of each component of the balun transformer 1 shown in FIG. 17 affects the characteristic thereof. Thus, it is difficult to apply the balun transformer 1 to a circuit of an apparatus such as a moving radio apparatus required to have a miniaturized construction.

SUMMARY OF THE INVENTION

Therefore, it is a primary object of the present invention to provide a chip type transformer which can be used as a balun transformer and can be miniaturized.

A chip type transformer according to the present invention comprises a dielectric substrate, a first strip line formed zigzag or spirally on one main surface of the dielectric substrate, a second strip line formed zigzag or spirally on the other main surface of the dielectric substrate and electromagnetically connected with a portion of the first strip line, and a third strip line formed zigzag or spirally on the other main surface of the dielectric substrate and electromagnetically connected with the other portion of the first strip line.

Since the first strip line, the second strip line and the third strip line are superimposed on one main surface and the other main surface of the dielectric substrate, a dielectric substrate having a large area is unnecessary for forming these strip lines. Further, since the first strip line, the second strip line and the third strip line are zigzag or spirally formed, they can be prevented from being extended long in a direction. Thus, this construction allows a compact chip type transformer to be manufactured.

In order to use the chip type transformer as the balun transformer, an unbalanced transmission line is connected with the first strip line, and two signal lines of a balanced transmission line are connected with the second strip line and the third strip line, respectively. The chip type transformer takes out a signal from the unbalanced transmission line, thus supplying the signal to a portion between the two signal lines of the balanced transmission line, or takes out a signal of the portion between the two signal lines of the balanced transmission line, thus supplying the signal to the unbalanced transmission line.

According to the present invention, a chip type transformer can be obtained which can be used as a balun transformer and can be miniaturized.

The above and other objects, features, aspects and advantages of the present invention will become more apparent from the following detailed description of the embodiments with reference to the accompanying drawings.

BRIEF DESCRIPTION OF THE DRAWINGS

FIG. 10 is a graph showing the relationship between a ratio L3/L2 and a phase difference between two input-output terminals to be connected with a balanced transmission line, wherein L3 is the length of a third strip line and L2 is the length of a second strip line.

DESCRIPTION OF THE PREFERRED EMBODIMENTS

Figure 1:
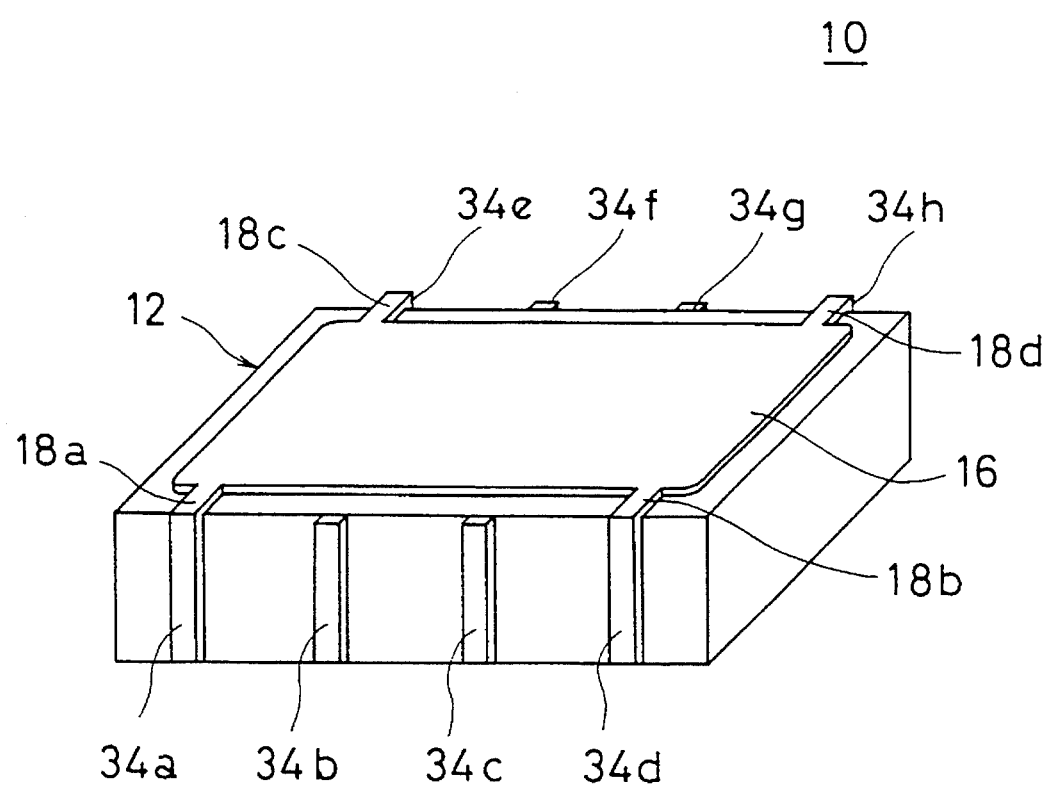
FIG. 1 is a perspective view showing one embodiment comprised in the present invention.

FIG. 1 is a perspective view showing one embodiment of the present invention. A balun transformer 10 used as a chip type transformer includes a laminate 12 comprising first through fifth dielectric substrates (layers) 14a, 14b, 14c, 14d, and 14e to be superimposed one on the other.

Figure 2:
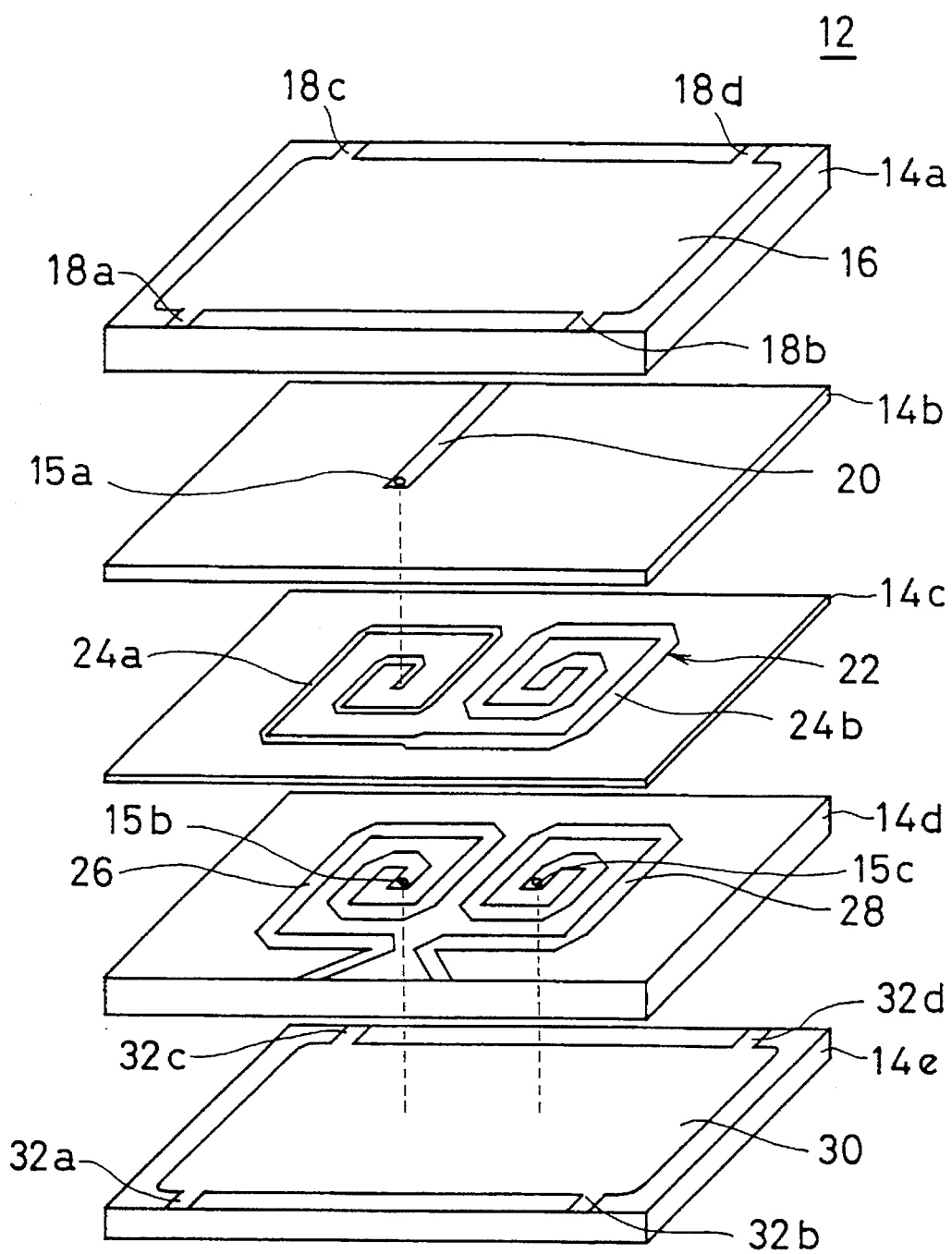
FIG. 2 is an exploded perspective view of a laminate comprised in the embodiment shown in FIG. 1.

As shown in FIG. 1 and FIG. 2, an earth electrode 16 is formed on almost all of one main surface of the first dielectric substrate 14a disposed uppermost on the laminate 12. Four drawing terminals 18a, 18b, 18c, and 18d are formed continuously with the earth electrode 16 toward edges of the first dielectric substrate 14a. In this case, the drawing terminals 18a and 18b are formed toward one edge of the first dielectric substrate 14a, with a predetermined interval provided therebetween. Whereas the other drawing terminals 18c and 18d are formed toward the other edge of the first dielectric substrate 14a, with a predetermined interval provided therebetween.

As shown in FIG. 2, a connecting electrode 20 is formed in a range from approximately the center toward an edge on one main surface of the second dielectric substrate 14b which is the second layer from the top layer of the laminate 12.

A first strip line 22 of a length $\lambda/2$ is formed on one main surface of the third dielectric substrate 14c which is the third layer from the top layer of the laminate 12. The first strip line 22 consists of a narrower first spiral portion 24a and a thicker second spiral portion 24b. The first portion 24a and the second portion 24b are spaced at a predetermined interval and having the same length. The outer end of the first portion 24a and that of the second portion 24b are formed to be continuous with each other. The inner end of the first portion 24a is connected with one end of the connecting electrode 20 through a via-hole 15a formed on the second dielectric substrate 14b, while the inner end of the second portion 24b is open-circuited.

On one main surface of the fourth dielectric substrate 14d which is the fourth layer from the top layer of the laminate 12, there are formed a second spiral strip line 26 having a length of $\lambda/4$ which is half of the length of the first strip line 22 and a third spiral strip line 28 having the length of $\lambda/4$ equal to the length of the second strip line 26. The second strip line 26 and the third strip line 28 are spaced at a predetermined interval. In this case, the second strip line 26 is formed in opposition to the first portion 24a of the first strip line 22, with the third dielectric substrate 14c sandwiched therebetween. Accordingly, the second strip line 26 is electromagnetically connected with the first portion 24a of the first strip line 22. That is, a coupler is constituted of the first portion 24a of the first strip line 22 and the second strip line 26. The third strip line 28 is formed in opposition to the second portion 24b of the first strip line 22, with the third dielectric substrate 14c sandwiched therebetween. Accordingly, the third strip line 28 is electromagnetically connected with the second portion 24b of the first strip line 22. That is, a coupler is constituted of the second portion 24b of the first strip line 22 and the third strip line 28. Further, the outer end of the second strip line 26 and the outer end of the third strip line 28 are formed toward an edge of the fourth dielectric substrate 14d.

An earth electrode 30 is formed on almost all of one main surface of the fifth dielectric substrate 14e disposed lowermost on the laminate 12. Four drawing terminals 32a, 32b, 32c, and 32d are formed continuously with the earth electrode 30 toward edges of the fifth dielectric substrate 14e. In this case, the drawing terminals 32a and 32b are formed toward one edge of the fifth dielectric substrate 14e, with a predetermined interval provided therebetween. Whereas the other drawing terminals 32c and 32d are formed toward the other edge of the fifth dielectric substrate 14e, with a predetermined interval provided therebetween. The earth electrode 30 is connected with the inner end of the second strip line 26 and the inner end of the third strip line 28 through each of via-holes 15b and 15c.

Referring to FIG. 1 in particular, eight outer electrodes 34a, 34b, 34c, 34d, 34e, 34f, 34g, and 34h are formed on side surfaces of the laminate 12. Of these outer electrodes, the four outer electrodes 34a–34d are formed on one side surface of the laminate 12, while the other four outer electrodes 34e–34h are formed on the other side surface of the laminate 12.

The outer electrodes 34a, 34d, 34e, and 34h are connected with the drawing terminals 18a, 18b, 18c, and 18d of the earth electrode 16, respectively, and also connected with the drawing terminals 32a, 32b, 32c, and 32d of the earth electrode 30, respectively. Thus, the outer electrodes 34a, 34d, 34e, and 34h are used as earth terminals.

The outer electrode 34b is connected with the outer end of the second strip line 26. The outer electrode 34c is connected with the outer end of the third strip line 28. The outer electrode 34f is connected with the other end of the connecting electrode 20 connected with the first strip line 22. The outer electrodes 34b, 34c, and 34f are used as input-output terminals.

Figure 3:
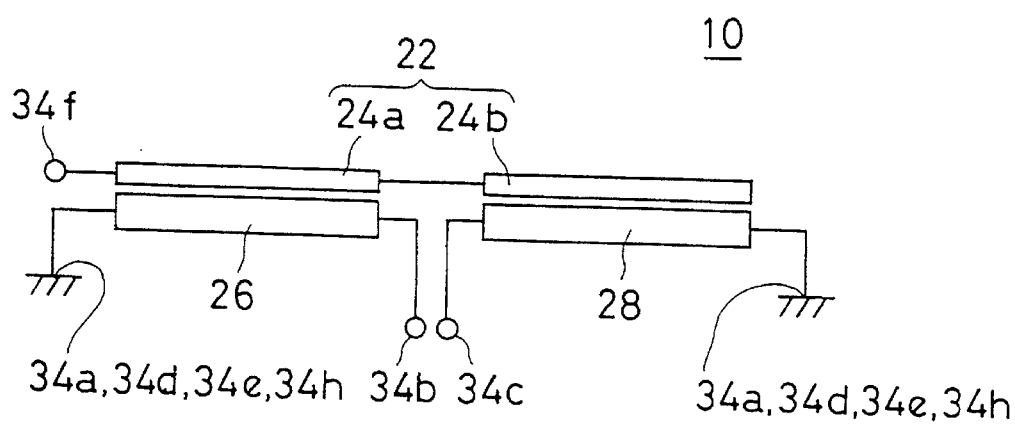
FIG. 3 is an equivalent circuit diagram of the embodiment shown in FIG. 1.

Thus, the balun transformer 10 has an equivalent circuit shown in FIG. 3.

In the balun transformer 10, since the first strip line 22, the second strip line 26 and the third strip line 28 are superimposed on one main surface and the other main surface of the third dielectric substrate 14c, a dielectric substrate having a large area is unnecessary for forming these strip lines. Further, in the balun transformer 10, since the first strip line 22, the second strip line 26 and the third strip line 28 are spirally formed, they do not have to be extended a long distance in any direction. Thus, the balun transformer 10 can be miniaturized.

In the balun transformer 10, in order to convert a signal of the unbalanced transmission line and that of the balanced transmission line into each other, the unbalanced transmission line is connected with the first strip line 22 via the outer electrode 34f and so on, and two signal lines of the balanced transmission line are connected with the second strip line 26 and the third strip line 28 via the outer electrodes 34b and 34c, respectively. The balun transformer 10 takes out the signal from the unbalanced transmission line, thus supplying the signal to a portion between the two signal lines of the balanced transmission line, or takes out the signal of the portion between the two signal lines of the balanced transmission line, thus supplying the signal to the unbalanced transmission line.

Figure 4:
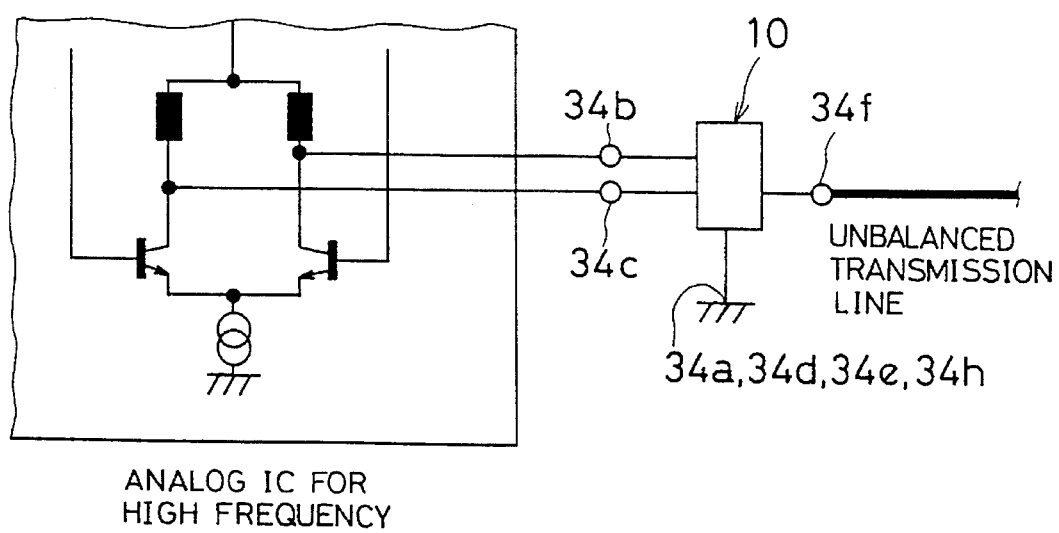
FIG. 4 is a circuit diagram showing an example of the application of the embodiment shown in FIG. 1.
Figure 5:
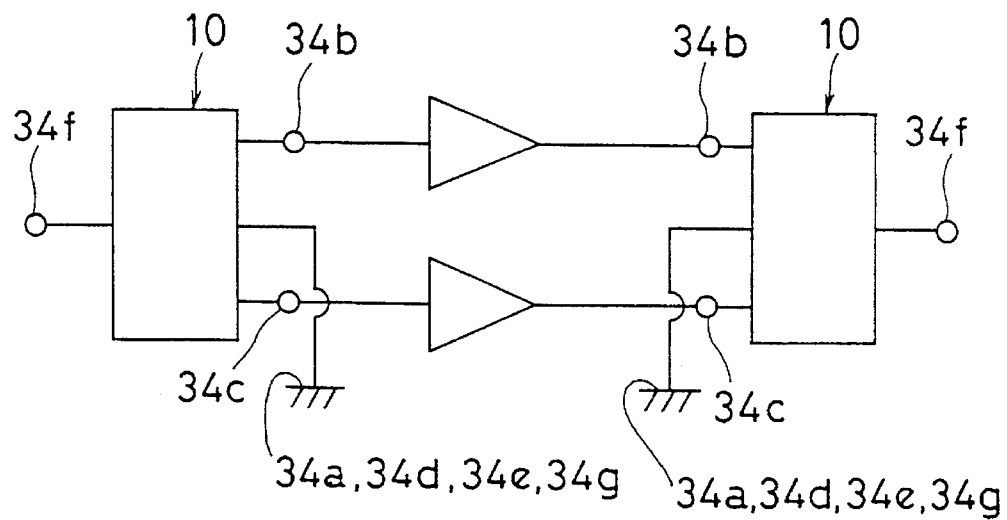
FIG. 5 is a circuit diagram showing another example of the application of the embodiment shown in FIG. 1.
Figure 6:
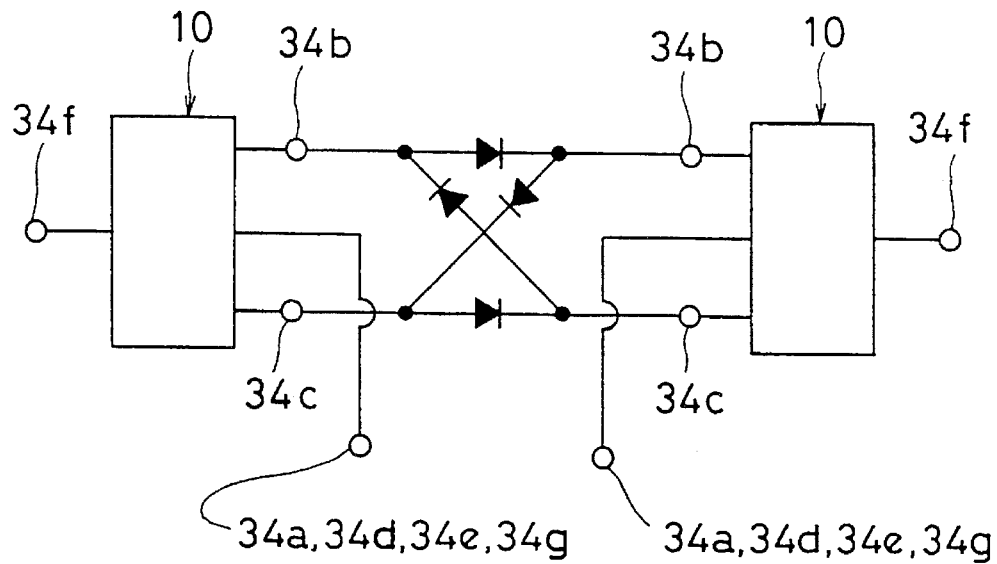
FIG. 6 is a circuit diagram showing still another example of the application of the embodiment shown in FIG. 1.

As shown in FIG. 4, one application of the balun transformer 10 is to carry an output signal outputted from two output terminals of an analog IC used to handle high frequencies to an unbalanced transmission line. In addition, the balun transformer 10 may be provided on input and output sides of two amplifiers of a balanced power amplifier as shown in FIG. 5, or used as a 180 degree phase converter of a double-balanced mixer as shown in FIG. 6.

An advantage of the balun transformer 10, is that the strip lines and the electrodes are connected with each other through the via-holes, and the outer electrodes disposed on the surface of the laminate 12 are used as terminals. Thus, the balun transformer 10 is preferable in electrical matching with another electric circuit.

In addition, since the earth electrode 16 is formed on the upper surface of the laminate 12, the balun transformer 10 has a shield effect. Preferably, the earth electrode 16 is formed at an appropriate interval from the strip lines so as to prevent the earth electrode 16 from adversely affecting the characteristic of the balun transformer 10. It is not always necessary that the earth electrode 16 is disposed on the upper surface of laminate 12, but may be covered with another dielectric substrate (layer).

Further, in the balun transformer 10, the outer electrodes serving as input-output terminals and earth terminals are formed on the surface of the laminate 12. Thus, the balun transformer 10 can be mounted on the surface of a printed circuit board.

In the balun transformer 10, it is possible to set the thickness of the dielectric substrate to a required value so as to change the characteristic impedance thereof. Thus, the characteristic impedance of the balun transformer 10 can be changed over a wide range.

Resin or ceramic dielectric material may be used as the material of the dielectric substrate. As shown by examples of the dielectric substrate shown below, the ceramic dielectric material has a smaller dielectric loss than the resin such as glass epoxy resin and has a superior heat radiation effect. Thus, when the ceramic dielectric material used as the material of the dielectric substrate, the dielectric loss can be small and it can be further miniaturized.

Glass epoxy resin: $\tan\delta=0.02$

Ceramic dielectric substrate: $\tan\delta=0.0007$

The balun transformer having a small conversion loss can be obtained by using the ceramic dielectric material or glass epoxy resin having a small dielectric loss as the material of the dielectric substrate and using a material such as copper having a high electrical conductivity as the material of the strip lines and the electrodes.

The balun transformer shown in FIG. 1 can be mass-produced by cutting a mother laminate into plurality of laminates 12. The mother laminate is formed by superimposing, one on the other, the large first dielectric substrate 14a on which a plurality of the earth electrodes 16 has been formed, the large second dielectric substrate 14b on which a plurality of the connecting electrodes 20 has been formed, the large third dielectric substrate 14c on which a plurality of the first strip lines 22 has been formed, the large fourth dielectric substrate 14d on which a plurality of the second and third strip lines 26 and 28 has been formed, and the large fifth dielectric substrate 14e on which a plurality of the earth electrodes 30 has been formed.

Figure 7:
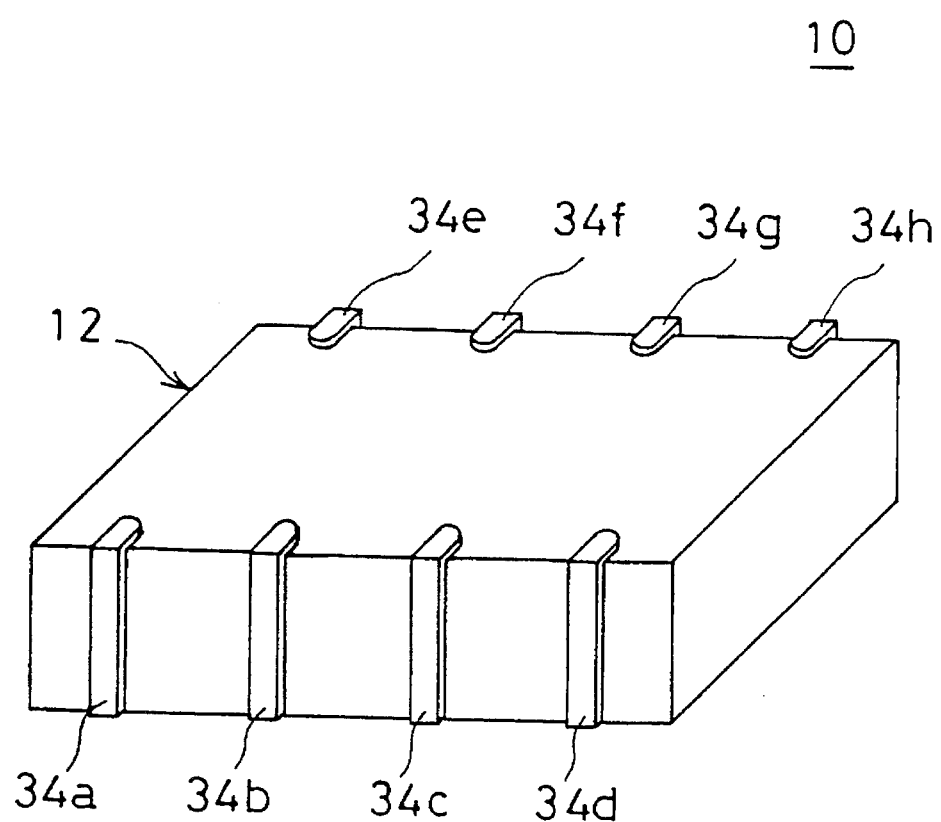
FIG. 7 is a perspective view showing another embodiment of the present invention.
Figure 8:
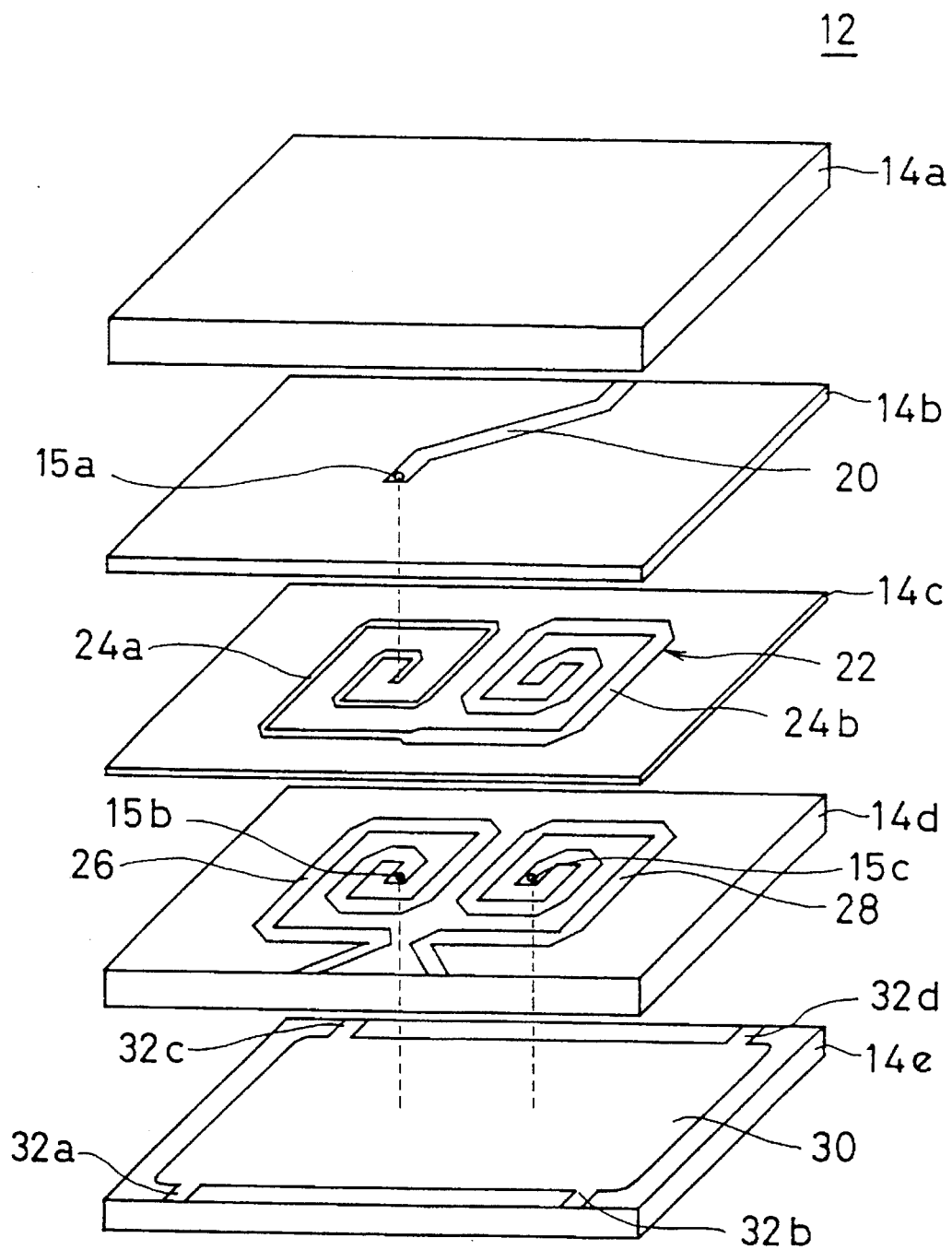
FIG. 8 is an exploded perspective view of a laminate comprised in the embodiment shown in FIG. 7.

FIG. 7 is a perspective view showing another embodiment of the present invention, FIG. 8 is an exploded perspective view of a laminate of which forms the embodiment shown in FIG. 7. In the embodiment shown in FIG. 7, compared with the embodiment shown in FIG. 1, no earth electrode is not formed on one main surface of the first dielectric substrate 14a disposed uppermost on the laminate 12.

Figure 9:
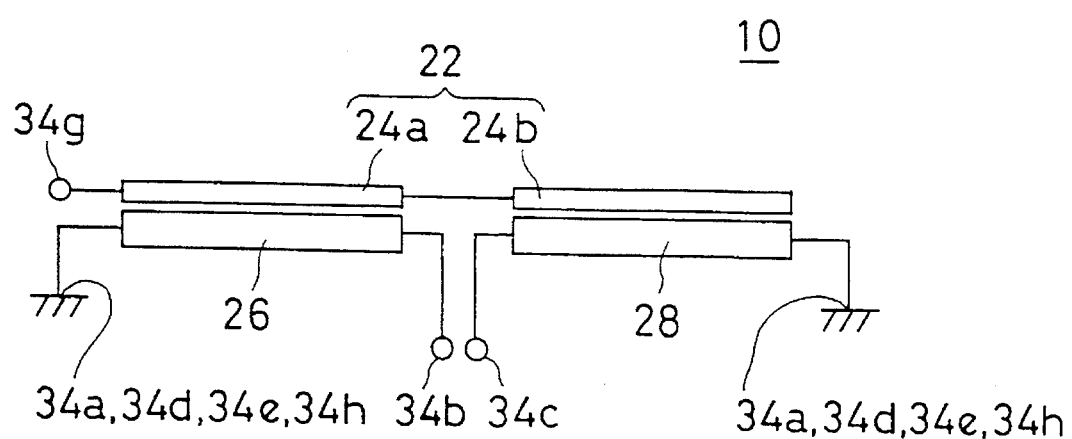
FIG. 9 is an equivalent circuit diagram of the embodiment shown in FIG. 7.
Figure 11:
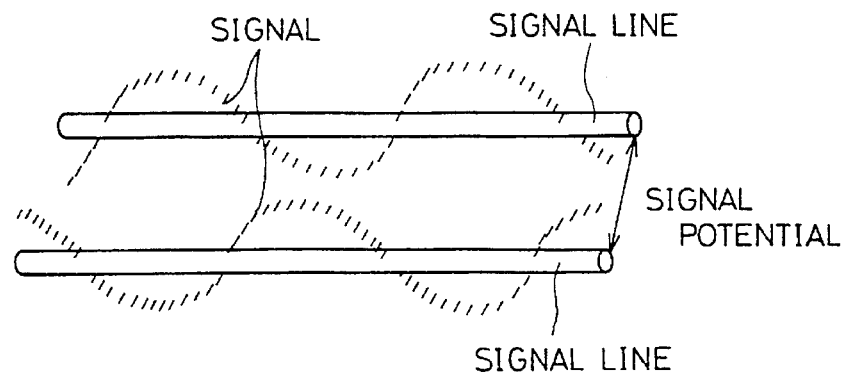
FIG. 11 is an illustrative view showing an example of a conventional balanced transmission line.
Figure 12:
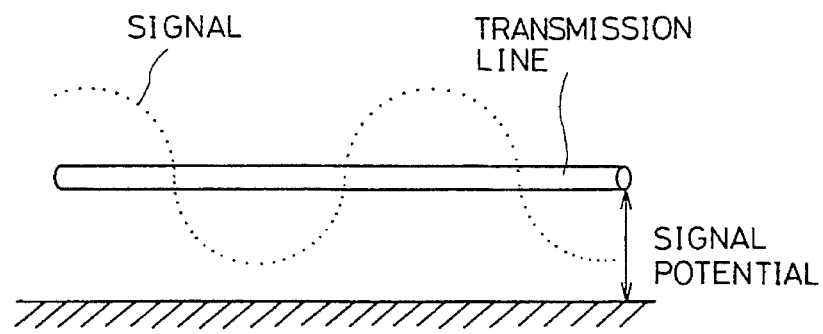
FIG. 12 is an illustrative view showing an example of a conventional unbalanced transmission line.
Figure 13:
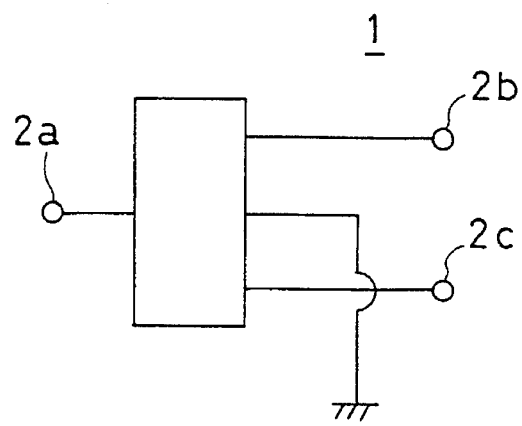
FIG. 13 is an illustrative view showing an example of a balun transformer which is in the background of the present invention and to which the present invention is applied.
Figure 14:
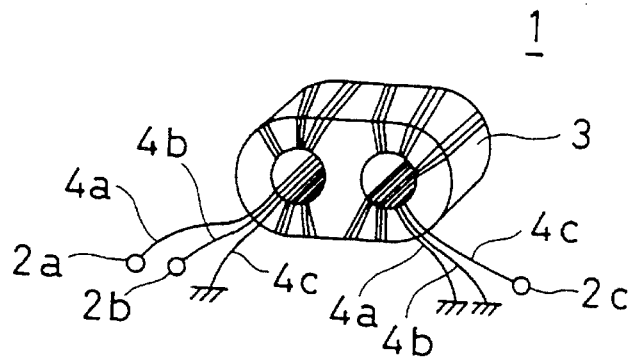
FIG. 14 is a perspective view showing an example of a conventional balun transformer used a core.
Figure 15:
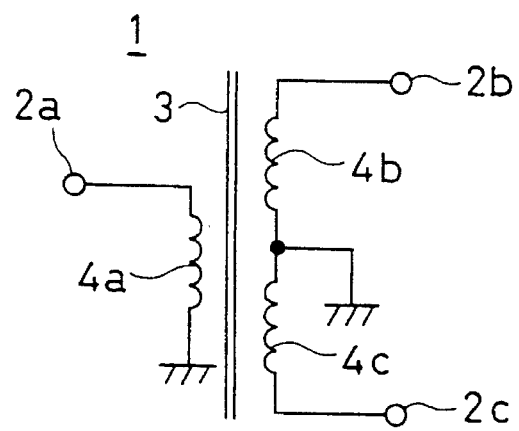
FIG. 15 is an equivalent circuit diagram of the balun transformer shown in FIG. 14.
Figure 16:
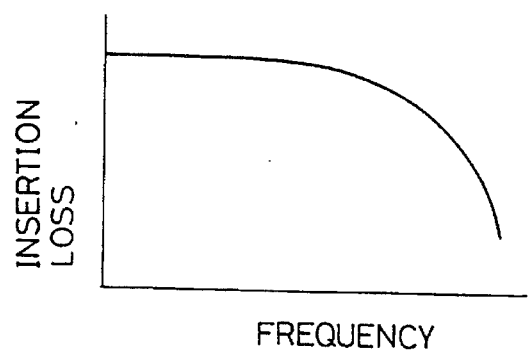
FIG. 16 is a graph showing the frequency characteristic of the balun transformer shown in FIG. 14.
Figure 17:
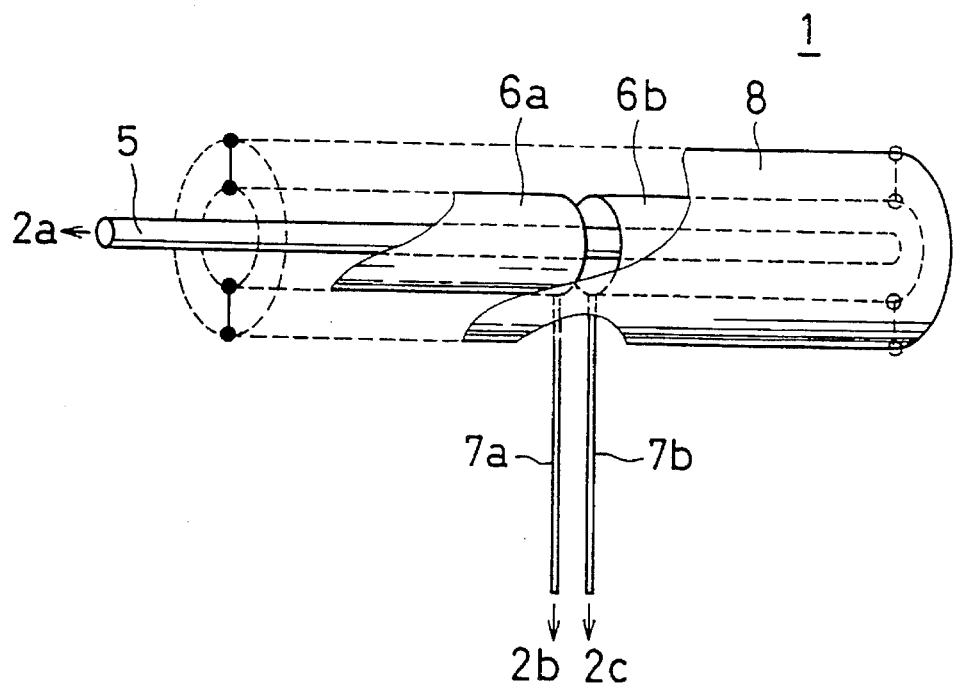
FIG. 17 is an illustrative view showing an example of a conventional balun transformer having a coaxial construction.
Figure 18:
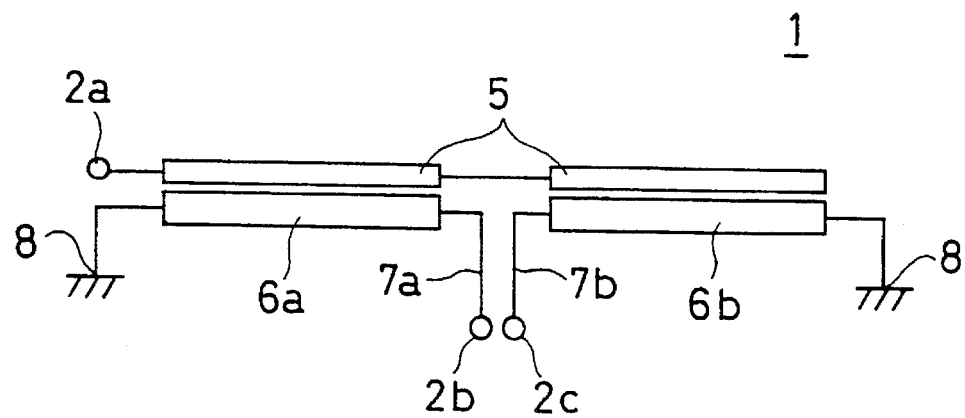
FIG. 18 is an equivalent circuit diagram of the balun transformer shown in FIG. 17.

In the embodiment shown in FIG. 7, the connecting electrode 20 is formed diagonally, and one end of the connecting electrode 20 is connected with the outer electrode 34a. Thus, the embodiment shown in FIG. 7 has an equivalent circuit shown in FIG. 9.

Further, in the embodiment shown in FIG. 7, the length of the first portion 24a of the first strip line 22 is set to be equal to that of the second strip line 26, and the length of the second portion 24b of the first strip line 22 is set to be equal to that of the third strip line 28. The length of the second portion 24b of the first strip line 22 is 1.08 as large as that of the first portion 24a of the first strip line 22, and also the length of the third strip line 28 is 1.08 as large as that of the second strip line 26.

The embodiment shown in FIG. 7 can be miniaturized, similarly to the embodiment shown in FIG. 1.

In the balun transformers 10 having the construction shown in FIG. 1 and FIG. 7, theoretically, the phase difference between the two input-output terminals to be connected with the balanced transmission line, namely, the phase difference between the outer electrodes 34b and 34c is 180 degrees, as a result of setting the lengths of the first portion 24a of the first strip line 22, the second portion 24b thereof, the second strip line 26, and the third strip line 28 to be equal to each other. But actually, it often occurs that the phase difference between the outer electrodes 34b and 34c is not 180 degrees. Unless the phase difference between the outer electrodes 34b and 34c is 180 degrees, noise generated in the two signal lines of the balanced transmission line connected with the outer electrodes 34b and 34c is not offset efficiently.

In the embodiment shown in FIG. 7, the length of the first portion 24a of the first strip line 22 is set to be equal to that of the second strip line 26, and the length of the second portion 24b of the first strip line 22 is set to be equal to that of the third strip line 28. The length of the first portion 24a of the first strip line 22 or the length of the second strip line 26 is set to be different from that of the second portion 24b of the first strip line 22 or the length of the third strip line 28. This construction allows the phase difference between the two input-output terminals, namely, the phase difference between the outer electrodes 34b and 34c to be adjusted to 180 degrees.

Accordingly, in the embodiment shown in FIG. 7, noise generated in the two signal lines of the balanced transmission line connected with the outer electrodes 34b and 34c can be offset efficiently.

In the balun transformer 10 having the construction shown in FIG. 7, the length of the first portion 24a of the first strip line 22 is set to be equal to that of the second strip line 26, and the length of the second portion 24b of the first strip line 22 is set to be equal to that of the third strip line 28. The relationship between a ratio L3/L2 (%) and the phase difference (degree) between the two input-output terminals to be connected with the balanced transmission line, namely, the phase difference between the outer electrodes 34b and 34c, is shown in FIG. 10. In the above, L2 is the length of the second strip line 26, and L3 is the length of the third strip line 28.

In each of the above-mentioned embodiments, the first portion 24a of the first strip line 22, the second portion 24b of the first strip line 22, the second strip line 26, and the third strip line 28 are set to a specific length, respectively. But they may be adjusted to an appropriate length, respectively, if the characteristic of the balun transformer 10 is to be altered.

Figure 19:
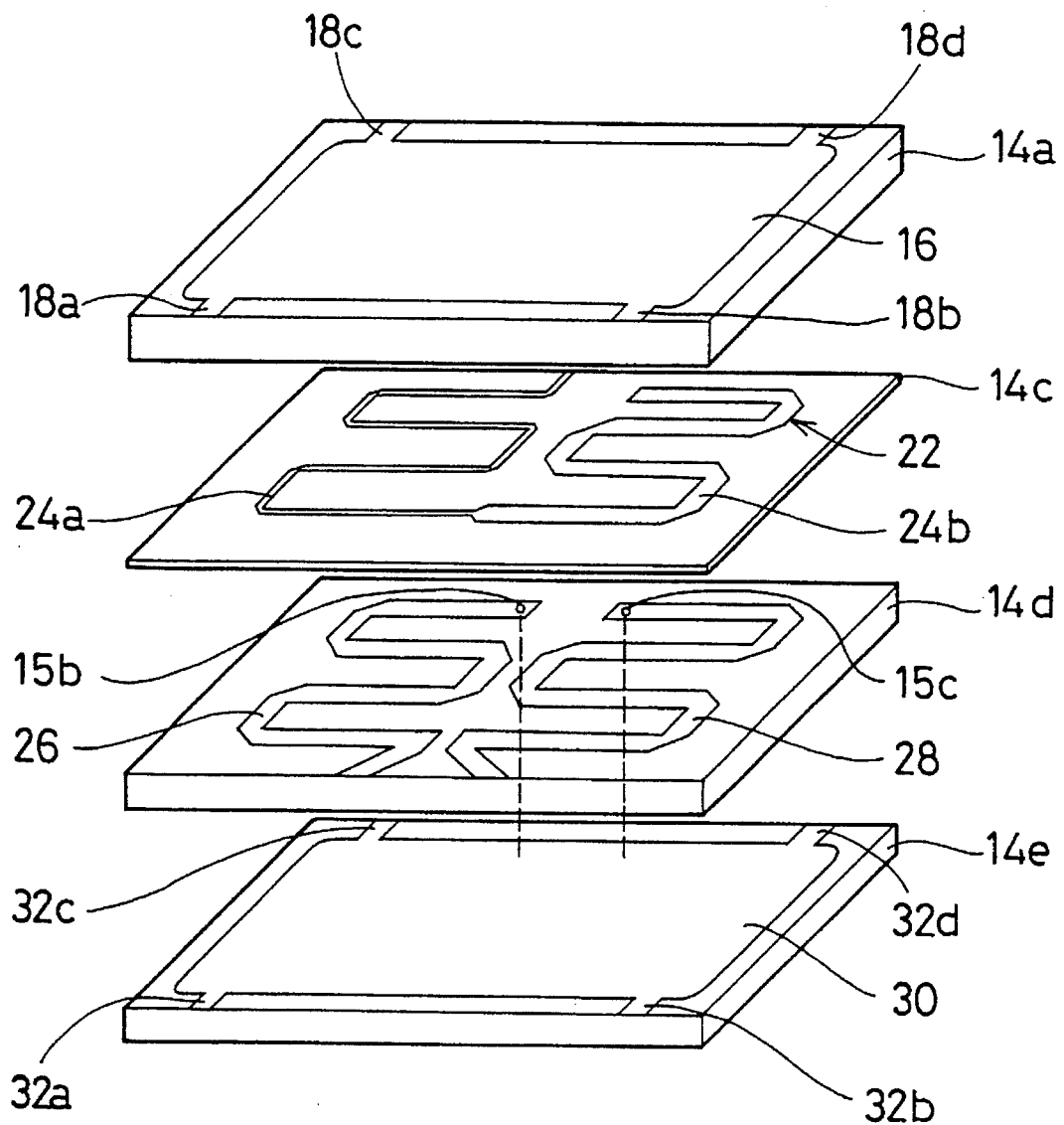
FIG. 19 is an exploded perspective view showing yet another embodiment of the invention.

In each of the above-mentioned embodiments, the first portion 24a of the first strip line 22, the second portion 24b thereof, the second strip line 26, and the third strip line 28 are spirally formed. But as shown in FIG. 19, it is possible to form them in a zigzag configuration in the present invention. The zigzag configuration also prevents them from extending along distance in any direction.

It will be apparent from the foregoing that, while the present invention has been described in detail and illustrated, these are only particular illustrations and examples, and the present invention is not limited to these.

What is claimed is:

1. A chip type transformer comprising:

a first strip line having a first portion and a second portion;

a second strip line with a shape corresponding to said first portion of said first strip line, which is opposite to said first portion with a dielectric substrate sandwiched therebetween; and a third strip line with a shape corresponding to said second portion of said first strip line, which is opposite to said second portion with said dielectric substrate sandwiched therebetween;

said second and third strip lines being opposite to an earth electrode with another dielectric substrate sandwiched therebetween, one end of each of said second and third strip lines being connected to said earth electrode.

2. A chip type transformer according to claim 1, wherein the length of the first portion of said first strip line is substantially equal to that of said second strip line; and the length of the second portion of said first strip line is substantially equal to that of said third strip line.

3. A chip type transformer according to claim 2, wherein the length of said second strip line is substantially equal to that of said third strip line.

4. A chip type transformer according to claim 2, wherein the length of said second strip line is substantially different from that of said third strip line.

5. A chip type transformer according to claim 1, wherein said first and second portions of said first strip line are formed in the shape of a spiral.

6. A chip type transformer according to claim 1, wherein said first and second portions of said first strip line are formed in a zigzag shape.

* * * * *